(12) United States Patent
Eifert et al.

(10) Patent No.: US 10,126,372 B2
(45) Date of Patent: Nov. 13, 2018

(54) METHODS FOR MONITORING THE STATE OF A BATTERY IN A MOTOR VEHICLE

(71) Applicant: FORD GLOBAL TECHNOLOGIES, LLC, Dearborn, MI (US)

(72) Inventors: Mark Eifert, Hessen (DE); Eckhard Karden, Aachen (DE)

(73) Assignee: Ford Global Technologies, LLC, Dearborn, MI (US)

( * ) Notice: Subject to any disclaimer, the term of this patent is extended or adjusted under 35 U.S.C. 154(b) by 170 days.

(21) Appl. No.: 14/919,982

(22) Filed: Oct. 22, 2015

(65) Prior Publication Data

US 2016/0117906 A1 Apr. 28, 2016

(30) Foreign Application Priority Data

Oct. 22, 2014 (DE) .................. 10 2014 221 468

(51) Int. Cl.
*G08B 21/18* (2006.01)
*G01R 31/36* (2006.01)

(52) U.S. Cl.
CPC ..... *G01R 31/3675* (2013.01); *G01R 31/3606* (2013.01); *G08B 21/185* (2013.01)

(58) Field of Classification Search
CPC ............ G01R 31/3606; G01R 31/3675; G08B 21/185
See application file for complete search history.

(56) References Cited

U.S. PATENT DOCUMENTS

| | | | | |
|---|---|---|---|---|
| 5,606,242 A | * | 2/1997 | Hull ...................... | H02J 7/0004 320/106 |
| 2004/0113629 A1 | | 6/2004 | Laig-Hoerstebrock et al. | |
| 2004/0140904 A1 | * | 7/2004 | Bertness ............. | B60L 11/1859 340/636.15 |
| 2008/0234956 A1 | * | 9/2008 | Mizuno .............. | G01R 31/3651 702/63 |
| 2013/0030623 A1 | * | 1/2013 | Thiamtong ........... | B60W 10/08 701/22 |
| 2014/0372055 A1 | * | 12/2014 | Wang ..................... | G01K 13/00 702/63 |

\* cited by examiner

*Primary Examiner* — Sisay Yacob
(74) *Attorney, Agent, or Firm* — Frank MacKenzie; Brooks Kushman P.C.

(57) ABSTRACT

An internal temperature of a battery is determined at defined intervals at different moments in time and is transmitted to an evaluation unit, which continuously determines a temperature gradient at least from the temperature values by dividing the temperature change in an interval by the time change in this interval. At least one limit value for the temperature gradient is stored in the evaluation unit, and the evaluation unit generates an alarm signal when the temperature gradient determined by the evaluation unit reaches this limit value.

8 Claims, 3 Drawing Sheets

METHODS FOR MONITORING THE STATE OF A BATTERY IN A MOTOR VEHICLE

CROSS-REFERENCE TO RELATED APPLICATION

This application claims foreign priority benefits under 35 U.S.C. § 119(a)-(d) to DE 10 2014 221 468.8, filed Oct. 22, 2014, which is hereby incorporated by reference in its entirety.

TECHNICAL FIELD

This disclosure relates to methods for monitoring the state of a battery in a motor vehicle, in which the internal temperature of the battery is determined and monitored.

BACKGROUND

By way of example, the starter battery of a motor vehicle is an accumulator, which delivers the electrical current for the starter of an internal combustion engine. The battery of an electric vehicle used to drive the vehicle is by contrast referred to as a traction battery. Electric vehicles or hybrid vehicles may also have a starter battery in addition. By way of example, lead accumulators or lithium-ion accumulators can be used as batteries, however these will also be referred to hereinafter as lead batteries or lithium-ion batteries.

In order to determine a battery issue, the battery temperature can be monitored, for example, since it is an indicator for the state of the battery. This is performed typically using a conventional pole niche sensor, which serves as a battery monitoring sensor (BMS). If the temperature measured using this sensor for example reaches a certain limit value, a critical state of the battery is assumed.

When determining the wear of a battery, however, the battery temperature may also be used in other ways. By way of example EP 1 387 177 A2 discloses a method for determining the wear of an electrochemical energy store, in which a wear variable is determined over time depending on the battery temperature. Here, the wear variable is determined as the sum over time of temperature-dependent wear rates, the values of the wear rates rising over proportionally with rising battery temperature. The over proportional influence of rising battery temperatures on the wear of the battery is therefore to be taken into consideration.

Vehicle systems in the low low-voltage range (14 ... 48V) are usually separate from electric drive systems, as found in electric vehicles and hybrid vehicles. In such low-voltage systems, however, battery monitoring is not usual.

SUMMARY

A method is used to monitor the state of a battery in a motor vehicle, the internal temperature of the battery being determined and monitored. The method is characterized in that the internal temperature (T) of the battery is determined at defined intervals at different moments in time (k) and is transmitted to an evaluation unit, which continuously determines a temperature gradient ($T_{Grad}$) at least from the temperature values (T1, T2) by dividing the temperature change ($\Delta T$) in an interval by the time change ($\Delta t$) in this interval. At least one limit value (S1) for the temperature gradient ($T_{Grad}$) is stored in the evaluation unit, and the evaluation unit generates an alarm signal when the temperature gradient ($T_{Grad}$) determined by the evaluation unit reaches this limit value (S1).

The temperature values may be transmitted to the evaluation unit directly or indirectly, for example from a sensor. Furthermore, the evaluation unit does not have to be an independent module, but its functionality may also be formed by the cooperation of a number of individual modules. The alarm signal generated by the evaluation unit may be processed here in different ways. By way of example, it may activate a sort of flag, which can then be taken into consideration by the system in different ways.

The method is preferably used during a charging process of the battery. Furthermore, the battery may be part of a low-voltage system of a motor vehicle, however the method is not limited to this field of application.

An alarm signal of the evaluation unit signals an irregular charging of the battery. From this, a state of the battery can also be determined, in which case on the one hand the charging capacity of the battery is reduced. This state is also referred to as a "degraded battery".

The internal temperature (T) of the battery may be determined here in different ways, wherein it is usually only estimated. The "internal temperature" of the battery thus also designates a temperature that corresponds only approximately to the temperature within the battery. Here, by way of example, the measured temperature of a temperature sensor at a pole of the battery can be used in order to indirectly determine from this the internal battery temperature. However, other methods for determining or estimating the internal battery temperature may also be used. By way of example, these may be models that use temperatures in the immediate surroundings of the battery.

In one embodiment temperature signals are processed or conditioned by the evaluation unit prior to the determination of the temperature gradient ($T_{Grad}$). This in particular has the advantage that the system can thus be better protected against signal interference between the sensor or a communication network and the evaluation unit or within a system of wiring. Interference of this type could otherwise cause short-term measurement errors, and a resultant erroneous temperature gradient determination could lead to false alarms.

In accordance with the processing of the temperature data, the mean value of the temperature values in a defined monitoring interval $T_{Monitor}$ is preferably calculated in particular, only the temperature values falling between an absolute maximum and an absolute minimum being taken into consideration in this mean value calculation. Furthermore, an abnormal temperature value is rejected and not used in the mean value calculation when the change in temperature between two successive temperature values exceeds a defined limit value within the monitoring interval $T_{Monitor}$. This processing of the temperature data in the form of a sliding mean value calculation prevents unlikely temperature values, which may determine a measurement error, from being taken into consideration in the subsequent determination of the temperature gradient. However, a mean value calculation could also be performed without a condition of this type.

The processing may also be supplemented by the approach that temperature values assessed as being abnormal and rejected are still used for the mean value calculation when the time within which temperature values have been continuously dismissed reaches a defined limit value. The temperature gradient can be calculated and corrected in this way if the temperature has actually changed, even if falsified temperature data had prevented a recording of this change over a long period.

When monitoring the battery temperature for example via a pole niche sensor, it must be noted however that an increase of the temperature measured there can be caused by various influences. It can be attributed on the one hand to an internal heating of the battery, which is indicative of a weakened or damaged battery. However, it may also be caused partly or completely by external heat sources. If temperature increases by external heat sources are not taken into consideration, a monitoring system of the vehicle would often indicate a damaged battery, or might even separate the battery from the voltage source over the course of a risk minimization strategy, although the battery is intact. This is to be avoided since it impairs the functionality of the vehicle and false alarms lead to customer dissatisfaction.

In order to solve this problem the method in a further embodiment therefore proposes correcting the temperature values by using in each case the difference from a determined battery temperature and the external temperature of the battery as temperature values (T1, T2) for the mean value calculation. In this way the influence of heat sources in the surroundings of the battery on the temperature measured at the battery pole can be taken into consideration and reduced. It is thus also possible to compensate for changing ambient temperatures.

For this purpose the battery is preferably accommodated in a battery housing which shields the battery externally to the greatest possible extent against heat influences. The internal temperature of the battery may then be measured at the pole niche sensor within the battery housing, whilst the ambient temperature is determined by way of example via a further temperature sensor mounted at another point in the housing.

If the ambient temperature is unavailable or if, for other reasons, only the measured internal temperature of the battery is to be used or can be used, the limit value (S1) for the temperature gradient should usually be set sufficiently high in order to reduce the risk of false alarms. However, this may mean that irregular states of charge, which cause merely low temperature gradients, are not detected. In order to reduce this risk, the limit value (S1) to be applied may also be selected depending on the operating mode of the vehicle. Additionally or alternatively, it may therefore be that a number of limit values are stored in the evaluation unit for different operating states of the motor vehicle, the limit value (S1) to be applied for the comparison with the temperature gradient ($T_{Grad}$) being selected depending on the current operating state of the motor vehicle.

In the case of plug-in electric vehicles and plug-in hybrid vehicles, it may be assumed by way of example that temperature gradients by external heat sources during the charging process are lower at standstill than during driving operation. Different limit values can therefore be calibrated for this purpose, stored for these two vehicles states, and then used depending on whether the vehicle is moving or is in the charging state. In principle, limit values can be calibrated here by comparison tests between intact and gassing batteries. The limit values can then be further optimized for any vehicle mode to the extent that they ignore or take into consideration expected temperature changes in the surroundings of the battery.

A consideration of the ambient temperature for the temperature gradient determination usually requires a second sensor and a battery housing in order to distinguish between external and internal heat sources. This is associated with greater outlay for the embodiment of the battery. Furthermore, a battery housing requires additional space. Should these disadvantages be avoided, increased temperature gradients on account of damaged batteries can also be differentiated in another way from increased temperature gradients that exist due to external heat sources.

By way of example, it may be that the temperature gradient ($T_{Grad}$) is recorded and monitored over time, and the evaluation unit only generates an alarm signal when the temperature gradient ($T_{Grad}$) reaches the limit value (S1) and then remains constant or rises. In this way the temperature gradient is monitored and tracked continuously, and, by means of this tracking over a calibrated period, it is possible to diagnose irregular states of charge of the battery only when the temperature gradient remains constant or continues to rise once a limit value has been reached. If, by contrast, it falls steadily once it has reached a limit value, it is concluded that the temperature rise was caused by other heat influences, but the battery is not damaged.

The algorithm for identifying irregular states of charge of a battery via the gradient of the internal temperature of the battery may also be supplemented by a simultaneous monitoring of the charging current during the charging process. When an intact battery is charged, the charging current falls steadily over the course of the charging process. When the charging current by contrast rises within a certain period and the battery temperature also rises, it can be assumed with high probability that the charging capability of the battery is weakened and there is a development of gas. In accordance with one embodiment the charging current is therefore measured during a charging process of the battery, and the evaluation unit generates an alarm signal only when the temperature gradient ($T_{Grad}$) reaches the limit value (S1) and the charging current rises over the period of the charging process.

An alarm signal of the evaluation unit may thus be generated in different ways, wherein different influences, effects and resultant measurements can be taken into consideration. The alarm signal can also be utilized in different ways. In the case of an alarm signal of the evaluation unit, a warning message for example appears in the region of the instrument panel and may be provided by a warning light. The driver of a vehicle is thus informed of the critical state of the battery and can take corresponding countermeasures, which in particular includes the replacement of the battery. Here, service staff can be informed in order to make a diagnosis by means of error codes.

Furthermore, risk minimization strategies can be introduced, wherein for example the battery voltage may be adjusted such that negative effects are minimized and there is thus only a partial failure. In particular, the voltage setpoint value of the charging voltage can be set such that the current into the battery and from the battery is minimized. In addition, systems that are operated by the battery can be switched off, or the battery can be completely separated from the system. This can be implemented for example by means of a relay, in particular a solid-state relay (SSR).

Since algorithms for identifying damaged batteries often generate error messages although the battery is intact, here however a warning notice for example may be generated in the instrument panel and/or an error code may be generated in a diagnosis system only when the evaluation unit has generated a defined number of alarm signals within a number of successive phases of operation. By way of example, an irregular charging process is identified only when an alarm signal indicating a damaged battery has been generated at least three times in the last five operating phases.

DETAILED DESCRIPTION

Figure 1:
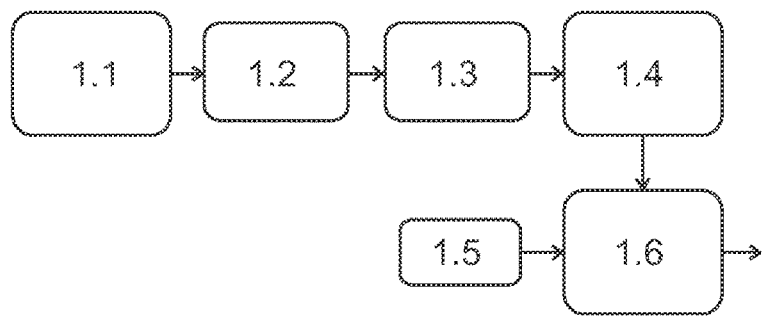
FIG. 1 shows the basic diagram of the method for monitoring the state of a battery via a temperature gradient and a limit value.

FIG. 1 shows the basic diagram of an exemplary embodiment of the method for monitoring the state of the battery via a temperature gradient and a corresponding limit value. Here, in step 1.1, the internal temperature of the battery is determined via a battery monitoring sensor (BMS), which is mounted at a pole of the battery. This may be performed using a known pole niche sensor. The battery temperature signal thus obtained can be processed or conditioned in steps 1.2 and 1.3. By way of example, a mean value calculation can be performed here, and the temperature values thus processed are then fed to an evaluation unit. This evaluation unit in step 1.4 performs a continuous temperature gradient calculation by dividing the temperature change $\Delta T$ in a certain interval by the time change $\Delta t$ in this interval ($T_{Grad}=T_2-T_1/t_2-t_1$). The temperature gradient $T_{Grad}$ thus obtained is compared in step 1.6 with a limit value S1, which was previously calibrated in step 1.5 and stored in the evaluation unit. If the temperature gradient $T_{Grad}$ reaches this limit value S1 or exceeds said value, this is assessed as an irregular state of charge. The evaluation unit thus generates a signal, which can be further processed in different ways. Here, the signal gives an indication of the fact that the battery shows a development of gas and/or signs of damage.

By way of example, a mean value calculation or a sliding mean value calculation can be used for the signal conditioning. Here, the following steps are performed and the following conditions are taken into consideration:

The temperature signal is averaged over a calibrated period of time $T_{Monitor}$.

Only temperature values that fall between an absolute maximum and a possible minimum are used for the mean value formation.

Within the monitoring period $T_{Monitor}$ a deviation between two successive temperature values lying within the minimum and maximum limits must not exceed a further predefined limit value. If this limit value is exceeded, the deviating temperature is not used in the calculation of the mean value. This signal conditioning is preferably performed before the evaluation unit calculates the temperature gradient.

This filter algorithm thus removes temperature values that are not plausible, which may be created by disruptions in the system, and replaces these with plausible values.

Figure 2:
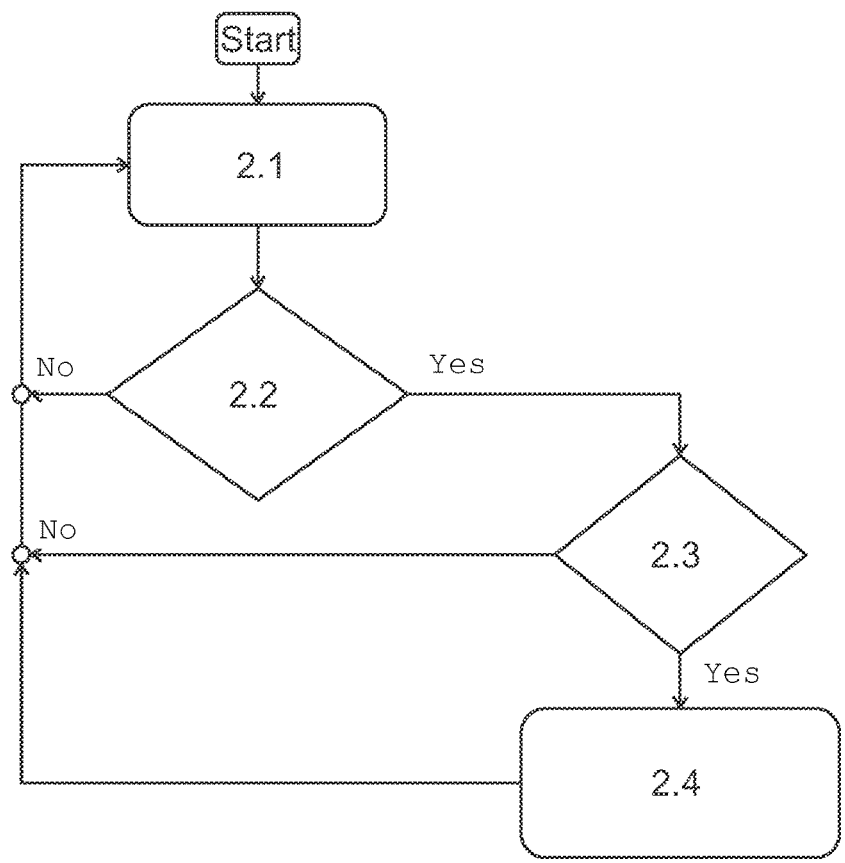
FIG. 2 shows the diagram of an embodiment of the method in which temperature values are processed via a sliding mean value.

FIG. 2 shows the diagram of an embodiment of the method in which temperature values are processed via a mean value. Here, following the start of the algorithm in step 2.1, the time that has elapsed since the last gradient calculation is first determined. If a new gradient calculation is pending (step 2.2), new data is queried in step 2.3 from the signal conditioning and the sliding mean value calculation. If fresh data is present, the temperature gradient is calculated therefrom (step 2.4).

Figure 3:
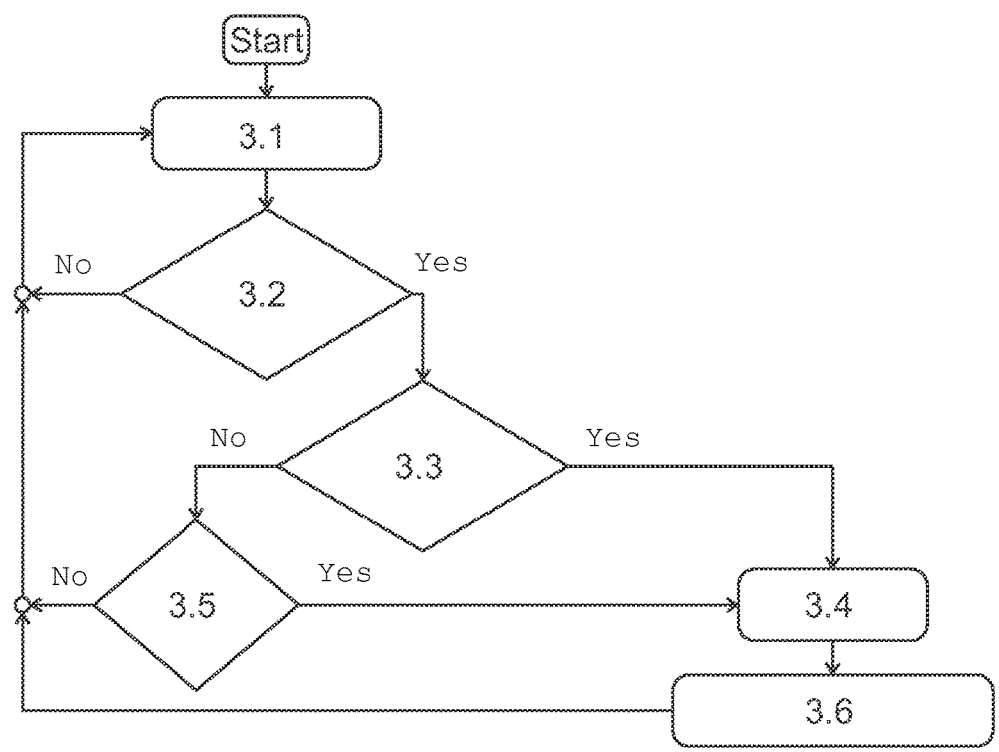
FIG. 3 shows the principal diagram of an embodiment of the method in which temperature values are processed.

The steps of signal conditioning can be inferred from the flow diagram of FIG. 3. This shows that, following the start of the algorithm in step 3.1, the internal battery temperature T and a timestamp t (TimeStamp) are first read out. It the examination in step 3.2 reveals that the temperature T lies between plausible limit values MthValue and MaxValue, it is checked in step 3.3 whether the measured temperature change likewise lies in plausible limits. If this is not the case, the new temperature data is not used for the calculation of the mean value, but instead it is checked whether old data from the sliding mean value is present (step 3.5), and this is used for a new mean value calculation (step 3.4). In the event of plausible temperature values, a new sliding mean value is by contrast calculated in step 3.4 using the current temperature values. In addition, the timestamp t at which an expedient temperature value T was present is stored (step 3.6).

FIG. 3 shows a further possible feature of the signal conditioning, in accordance with which the time within which temperature values are not plausible and are thus rejected is determined. If this time exceeds a defined period (t−TimeStamp>=OldDataTimeThresh) the data that is not plausible is still used for the sliding mean value calculation. In order to calculate the temperature gradient, the temperature is queried from the sliding mean value calculation at regular intervals. If a calibrated moment in time is achieved for this purpose and the data of the sliding mean value calculation is current, the temperature is queried and the temperature gradient is calculated. If the data of the sliding mean value calculation by contrast has not been recently renewed because the temperature for example was outside the maximum and minimum limit values or demonstrated extreme fluctuations, the temperature gradient is calculated in a manner delayed until an update of the mean value data. The difference between the current time and the timestamp that is set when the sliding mean value is calculated is used in order to determine whether the mean temperature can be used in the calculation of the temperature gradient. If the temperature from the sliding mean value is fresh, this difference will be smaller than a calibrated limit value DataUpdateTimeThresh. In this case the temperature gradient is calculated with sampled temperature values $T_1$ and $T_2$ at the times $t_1$ and $t_2$.

Figure 4:
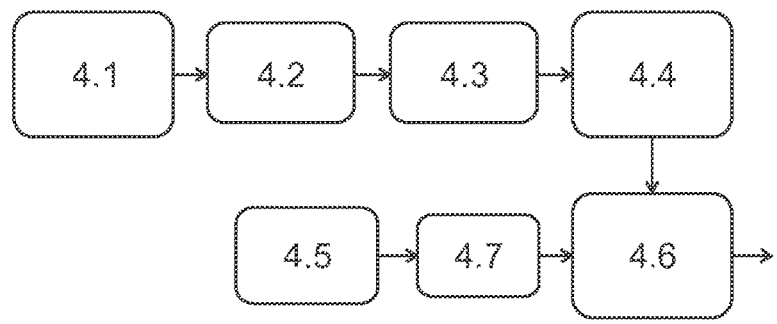
FIG. 4 shows the diagram of an embodiment of the method in which different limit values are used depending on the type of vehicle operation.

FIG. 4 shows the diagram of an embodiment of the method in which different limit values are used depending on the type of vehicle operation. For this purpose, different limit values are determined for different operating states of the vehicle and are stored in the evaluation unit. In the comparison of the calculated temperature gradient with a limit value, the limit value associated with the current vehicle mode then flows in. Here, steps 4.1 to 4.4 and 4.6 correspond to steps 1.1 to 1.4 and 1.6 in FIG. 1. Merely in step 4.5 is it now initially determined in which operating mode the vehicle is currently operating, and the limit value associated with this operating mode is selected (step 4.7).

In order to be able to distinguish between increased temperature gradients caused by damaged batteries and those caused by external heat sources, the temperature gradient can be tracked. The diagram of such an embodiment of the method is illustrated by way of example in FIG.

5. In the case of such a tracking the temperature gradient is recorded over time and an irregular state of charge is only detected when the temperature gradient remains constant or rises. If, by contrast, it drops, this indicates that the temperature gradient is not based on an internal heating of the battery, but has been triggered by external heat sources. This assessment is based on the consideration that the temperature gradient of a body, i.e. the battery, heated by an external heat source falls to zero asymptotically when the temperature of the body approximates the temperature of the external heat source. If the temperature gradient therefore does not fall steadily, this indicates that an internal heating contributes to the temperature gradient.

Figure 5:
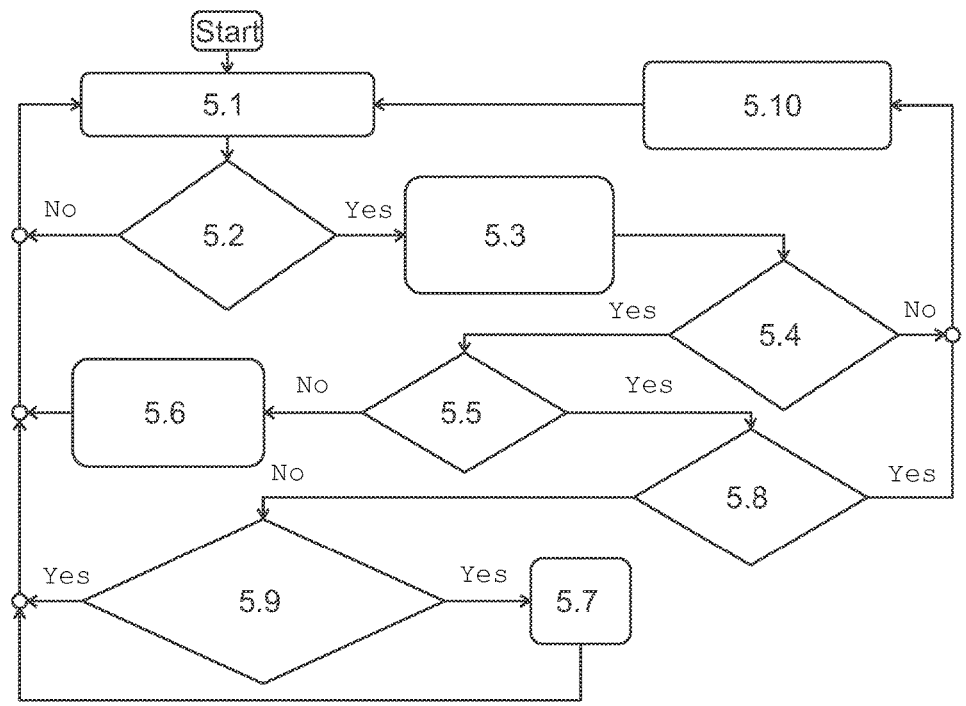
FIG. 5 shows the diagram of an embodiment of the method in which a tracking of the temperature gradient is used.

The entire algorithm of the gradient monitoring, for example in the case of lead accumulators, is shown schematically in FIG. 5. This process can be summarized as follows: Following the start of the algorithm in step 5.1 the time since the last gradient determination is determined. If it is determined that a new calculation is due (step 5.2), the temperature gradient is calculated in step 5.3. The temperature gradient is thus calculated at regular intervals. If this temperature gradient is not greater than the calibrated value MaxTempGrad (step 5.4), the respective timestamp is deleted and the temperature gradient is stored. Furthermore, a signal HighGradFlag is deactivated (step 5.10). If, by contrast, the temperature gradient is greater than the calibrated value MaxTempGrad (step 5.4), it is checked in step 5.5 whether a signal HighGradFlag is set. If this is not the case, a timestamp and the calculated gradient are stored in a non-volatile memory, and the signal HighGradFlag is activated (step 5.6). The temperature gradient is now monitored over a defined period of time GradMonPeriod, and it is checked whether it drops (steps 5.8 and 5.9). If subsequent gradients drop during this period GradMonPeriod by at least MinGradDecrement compared with the stored gradient, the notice HighGradFlag is deactivated. If, up to the end of GradMonPeriod, subsequent gradients have not fallen, this is identified as an irregular charging process (step 5.7). Here, the gradient monitoring period GradMonPeriod should be selected to be long enough to enable even an extremely high gradient on account of an external heat source to drop to a value that lies below a calibrated value used to identify internal heating.

Figure 6:
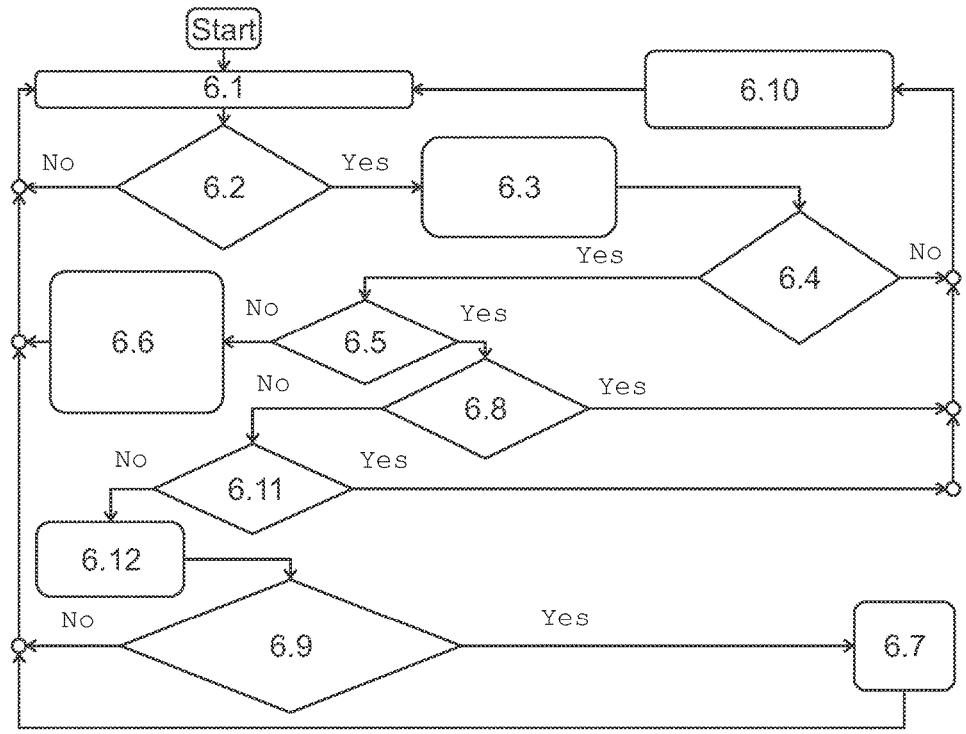
FIG. 6 shows the diagram of an embodiment of the method n which the charging current of the monitored battery is monitored during a charging process.

In order to avoid false positive identifications of irregular states of charge on account of increased temperature gradients, the algorithm can be extended to a monitoring of the charging current. The diagram of such an embodiment of the method is shown by way of example in FIG. 6 and corresponds in steps 6.1 to 6.5 and 6.7 to 6.9 to the steps 5.1 to 5.5 and 5.7 to 5.9 of FIG. 5.

With an intact battery the charging current will drop continuously during the course of the charging process. If, by contrast, the charging current rises during the course of a charging process and the battery temperature measured via the pole niche sensor also rises, it can be assumed with high probability that the battery is weakened and is gassing. In addition to the detection of high temperature gradients, the battery current may thus be queried when a temperature gradient has been determined that exceeded the calibrated limit value MaxTempGrad. This occurs in step 6.11. In the event of any following gradient calculation during the calibrated period GradMonPeriod, the charging current should also be queried. If, in step 6.11, it is determined that this battery current drops by a calibrated value MinCurrentDecrement whilst the temperature gradient remains above the limit value MaxTempGrad, it can be assumed that the increased temperature gradient has been caused by external heat sources. In this case it may be that no irregular charging process is identified, although the determined temperature gradient is increased (step 6.7).

If, by contrast, the charging current does not fall, this indicates a weakened battery. In this case the battery continuously takes on current at a constant charging voltage and is anticipated to fail imminently. Then, a current value is stored with this battery current (step 6.12). Here, the state of charge of the battery is also to be taken into consideration at the start of the charging process. If, by way of example, the state of charge (SOC) of a lead accumulator is low, the charging current at the start of the charging process will be high, but will then drop steadily to a value below 1.5 A when voltages of a normal temperature-dependent equalization charging are used. The time until an absolute current limit value is thus dependent on the original state of charge of the battery and the battery temperature. In order to prevent incorrect identifications of an irregular charging process, which are based on a low state of charge of the battery, the current limit value may be selected in a manner dependent on temperature, and the time above the current limit value is only measured when the state of charge SOC lies above a calibrated limit value.

In addition, the charging current gradient can be monitored. The same is true for the time over which a current exceeds a certain limit value. The charging current gradient is calculated here by determining the current I continuously at different times t. The current gradient is then given from the quotient of $\Delta I$ to $\Delta t$. The current gradient of an intact battery should always be negative or zero, unless the charging process starts when it is very cold. In order to avoid false positive identifications of irregular states of charge, the calibrated period within which the charging current is monitored should be selected to be long enough to record any initial rise of the current based on battery heating. By way of example, the period of time may be more than 20 minutes. In this case it is not absolutely necessary to only start the monitoring when the state of charge of the battery SOC lies above a limit value. The algorithm can thus be simplified in that the comparison of the state of charge SOC with a calibrated limit value is spared. The algorithm may also be further simplified in that irregular states of charge are only identified when the charging current gradient exceeds a limit value for a long period of time. In this case there would be no comparison of the charging current with the calibrated temperature-dependent limit value.

The monitoring of the charging current, the charging current gradient, and the temperature gradient may thus be combined in one algorithm. With a faulty battery the internal battery temperatures and the charging current often rise jointly with time. This can usually be observed when the battery has been charged for a number of hours. In this case a positive charging current gradient precedes an extreme development of gas, which is accompanied by a rise in temperature. In order to avoid false positive identifications of irregular states of charge, the charging current gradient and the temperature gradient may therefore be monitored. This may be supplemented by a determination of the time over which the charging current exceeds a certain limit value. If the temperature gradient and the charging current gradient exceed their limit values at the same time and the charging current exceeds a further limit value over a calibrated period of time, this indicates an irregular state of charge, which in turn indicates a damaged or defective battery.

What is claimed is:

1. A method for monitoring a battery of a motor vehicle comprising:
generating by an evaluation unit an alarm signal in response to a rate of change in internal temperature of the battery achieving a limit value, selected according to a current operating state of the motor vehicle such that the limit value is lower during standstill than during a driving operation, during a period in which a charge current for the battery is rising.

2. The method as claimed in claim 1, further comprising estimating the internal temperature based on data from a temperature sensor at a pole of the battery.

3. The method as claimed in claim 1, further comprising correcting the internal temperature based on an external temperature of the battery.

4. The method as claimed in claim 1, wherein the alarm signal is generated only if the internal temperature of the battery achieves the limit value and then remains constant or rises.

5. A motor vehicle comprising:
a battery; and
an evaluation unit configured to generate an alarm signal in response to a rate of change in internal temperature of the battery achieving a limit value, selected according to a current operating state of the motor vehicle, during a period in which a charge current for the battery is rising.

6. The motor vehicle as claimed in claim 5, wherein the evaluation unit is further configured to estimate the internal temperature based on data from a temperature sensor at a pole of the battery.

7. The motor vehicle as claimed in claim 5, wherein the evaluation unit is further configured to correct the internal temperature based on an external temperature of the battery.

8. The motor vehicle as claimed in claim 5, wherein the evaluation unit is configured to generate the alarm signal only if the internal temperature of the battery achieves the limit value and then remains constant or rises.

* * * * *